(12) United States Patent
Sferlazzo et al.

(10) Patent No.: US 9,869,021 B2
(45) Date of Patent: Jan. 16, 2018

(54) SHOWERHEAD APPARATUS FOR A LINEAR BATCH CHEMICAL VAPOR DEPOSITION SYSTEM

(71) Applicant: Aventa Technologies, Inc., Danvers, MA (US)

(72) Inventors: Piero Sferlazzo, Marblehead, MA (US); Dennis R. Stucky, Long Valley, NJ (US); Paul Thomas Fabiano, Lebanon, NH (US); Darren M. Simonelli, Seabrook, NH (US); Matthew C. Farrell, Revere, MA (US); Robert P. Couilliard, Plaistow, NH (US)

(73) Assignee: Aventa Technologies, Inc., Danvers, MA (US)

( * ) Notice: Subject to any disclaimer, the term of this patent is extended or adjusted under 35 U.S.C. 154(b) by 799 days.

(21) Appl. No.: 13/900,028

(22) Filed: May 22, 2013

(65) Prior Publication Data

US 2013/0270362 A1    Oct. 17, 2013

Related U.S. Application Data

(63) Continuation-in-part of application No. 12/787,082, filed on May 25, 2010, now Pat. No. 8,986,451.

(51) Int. Cl.
*C23C 16/00* (2006.01)
*C23C 16/455* (2006.01)
(Continued)

(52) U.S. Cl.
CPC .... *C23C 16/45565* (2013.01); *C23C 16/4584* (2013.01); *C23C 16/45578* (2013.01);
(Continued)

(58) Field of Classification Search
CPC ........ C23C 16/45578; C23C 16/45589; H01L 21/67784; H01L 21/68771; H01L 21/67109
See application file for complete search history.

(56) References Cited

U.S. PATENT DOCUMENTS 3,602,192 A   8/1971   Grochowshi et al.
3,805,736 A   4/1974   Foehring et al.
(Continued)

FOREIGN PATENT DOCUMENTS

JP    1050613    2/1998
KR    102004004642    6/2004

OTHER PUBLICATIONS

Notice of Allowance in related U.S. Appl. No. 13/469,515, dated Aug. 13, 2015; 7 pages.
(Continued)

*Primary Examiner* — Gordon R Baldwin
*Assistant Examiner* — Charlee Bennett
(74) *Attorney, Agent, or Firm* — Intrinsic Law Corp.

(57) ABSTRACT

A showerhead apparatus for a linear batch CVD system includes a movable showerhead, one or more gas supply conduits, and a translation mechanism. Each gas supply conduit provides a precursor gas to the showerhead. The showerhead includes conduits and channels arranged along the length of the showerhead to distribute precursor gas to the surfaces of substrates. The small distance between the substrates and the showerhead limits precursor gas flows from the channels to a small portion of each substrate beneath the showerhead. During a deposition process run, the translation mechanism causes the showerhead to move back and forth over the substrates along a direction perpendicular to a linear arrangement of the substrates. Parasitic deposition within the deposition chamber is substantially reduced in comparison to conventional showerhead appara-
(Continued)

tus. The ability to accurately control the precursor gas flows and the motion of the showerhead allows for improved thickness uniformity and device yield.

17 Claims, 12 Drawing Sheets

(51) Int. Cl.
*C23C 16/458* (2006.01)
*C23C 16/52* (2006.01)
*H01L 21/67* (2006.01)
*H01L 21/677* (2006.01)
*H01L 21/687* (2006.01)

(52) U.S. Cl.
CPC ........ *C23C 16/45589* (2013.01); *C23C 16/52* (2013.01); *H01L 21/67109* (2013.01); *H01L 21/67784* (2013.01); *H01L 21/68771* (2013.01)

(56) References Cited

U.S. PATENT DOCUMENTS

| | | | |
|---|---|---|---|
| 4,262,131 A | 4/1981 | Sih | |
| 4,579,080 A | 4/1986 | Martin et al. | |
| 4,823,736 A | 4/1989 | Post et al. | |
| 4,907,931 A * | 3/1990 | Mallory | H01L 21/67766 |
| | | | 414/416.03 |
| 5,119,760 A | 6/1992 | McMillan et al. | |
| 5,366,554 A | 11/1994 | Kanai et al. | |
| 5,788,777 A * | 8/1998 | Burk, Jr. | C23C 16/4584 |
| | | | 118/500 |
| 5,958,140 A | 9/1999 | Arami et al. | |
| 6,197,121 B1 | 3/2001 | Gurary et al. | |
| 6,416,579 B1 | 7/2002 | Thallner | |
| 6,578,515 B2 | 6/2003 | Sakamoto et al. | |
| 6,843,892 B1 | 1/2005 | McLeod | |
| 6,860,965 B1 | 3/2005 | Stevens | |
| 6,886,244 B1 | 5/2005 | McLeod et al. | |
| 7,041,202 B2 | 5/2006 | McLeod | |
| 7,153,368 B2 | 12/2006 | Preti et al. | |
| 7,270,510 B2 | 9/2007 | Putzi | |
| 8,303,713 B2 | 11/2012 | Belousov et al. | |
| 2002/0033133 A1 | 3/2002 | Klein et al. | |
| 2002/0034883 A1* | 3/2002 | Klein | C23C 14/50 |
| | | | 438/761 |
| 2002/0069827 A1 | 6/2002 | Sakamoto et al. | |
| 2003/0061989 A1 | 4/2003 | Kamimura et al. | |
| 2003/0072882 A1 | 4/2003 | Ninisto et al. | |
| 2004/0067641 A1 | 4/2004 | Yudovsky | |
| 2005/0249873 A1* | 11/2005 | Sarigiannis | C23C 16/4481 |
| | | | 427/248.1 |
| 2006/0126701 A1 | 6/2006 | Nozawa et al. | |
| 2006/0144335 A1 | 7/2006 | Lee et al. | |
| 2007/0077355 A1 | 4/2007 | Chacin et al. | |
| 2007/0172666 A1* | 7/2007 | Denes | B05D 1/62 |
| | | | 428/421 |
| 2008/0127892 A1* | 6/2008 | Kim | C23C 16/045 |
| | | | 118/712 |
| 2008/0213477 A1 | 9/2008 | Zindel et al. | |
| 2008/0251020 A1 | 10/2008 | Franken et al. | |
| 2009/0017190 A1 | 1/2009 | Sferlazzo et al. | |
| 2009/0042394 A1 | 2/2009 | Yamazaki et al. | |
| 2009/0098276 A1 | 4/2009 | Burrows et al. | |
| 2010/0291308 A1 | 11/2010 | Sferlazzo et al. | |
| 2011/0135842 A1* | 6/2011 | Faguet | C23C 16/4401 |
| | | | 427/569 |
| 2011/0305835 A1* | 12/2011 | Bertram, Jr. | C23C 16/45568 |
| | | | 427/255.23 |
| 2012/0186521 A1* | 7/2012 | Iwasaki | C23C 16/45517 |
| | | | 118/723 AN |
| 2012/0219713 A1 | 8/2012 | Sferlazzo et al. | |
| 2013/0260034 A1* | 10/2013 | Pak | C23C 16/45544 |
| | | | 427/248.1 |

OTHER PUBLICATIONS

Non-Final Office Action in related U.S. Appl. No. 13/469,515, dated Jan. 7, 2015; 9 pages.
First Office Action in related Korean patent application No. 10-2012-7033164, dated Oct. 6, 2014; 16 pages.
Notice of Allowance in related U.S. Appl. No. 12/787,082, dated Nov. 5, 2014; 8 pages.
Second Office Action in related Chinese patent application No. 20118033855.9, dated Nov. 19, 2014; 14 pages.
Non-Final Office Action in related U.S. Appl. No. 12/787,082, dated Jul. 15, 2014; 17 pages.
International Search Report & Written Opinion in related international patent application No. PCT/US14/35812, dated Sep. 5, 2014; 7 pages.
Final Office Action in related U.S. Appl. No. 12/787,082, dated Jan. 27, 2014; 16 pages.
First Office Action in related Japanese Patent Application No. 201180033855.9, dated Apr. 1, 2014; 11 pages.
Non-Final Office Action in Related U.S. Appl. No. 12/787,082, dated Aug. 29, 2013; 16 pages.
Office Action in related Korean Patent Application No. 10-2012-7033164, dated Apr. 8, 2015; 8 pages.
Final Office Action in related U.S. Appl. No. 13/469,515, dated Jun. 15, 2015; 6 pages.
International Search Report and Written Opinion in related international application No. PCT/US2011/036167, dated Jan. 9, 2012; 10 pages.
Final Office Action in related U.S. Appl. No. 12/787,082, dated May 15, 2013; 15 pages.
Non-Final Office Action in related U.S. Appl. No. 12/787,082, dated Feb. 11, 2013; 17 pages.

* cited by examiner

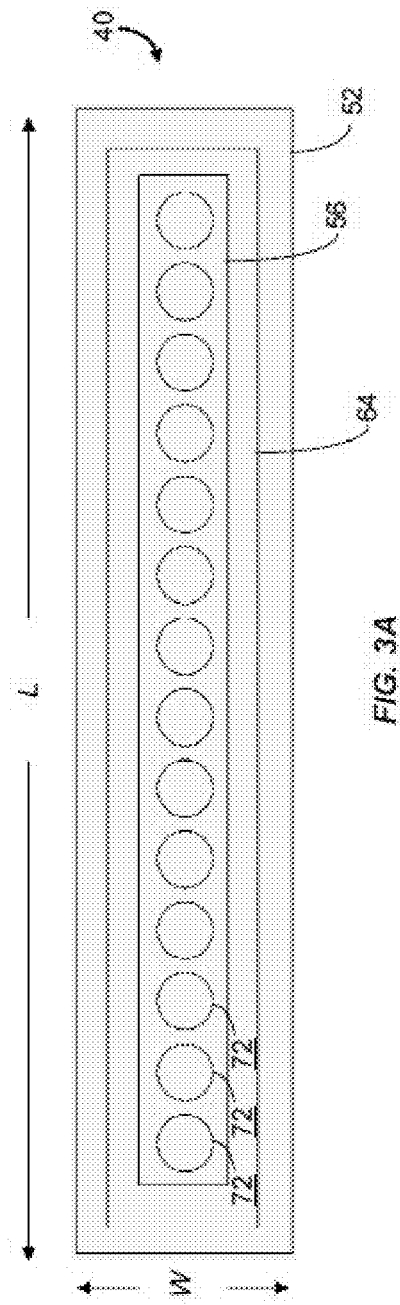
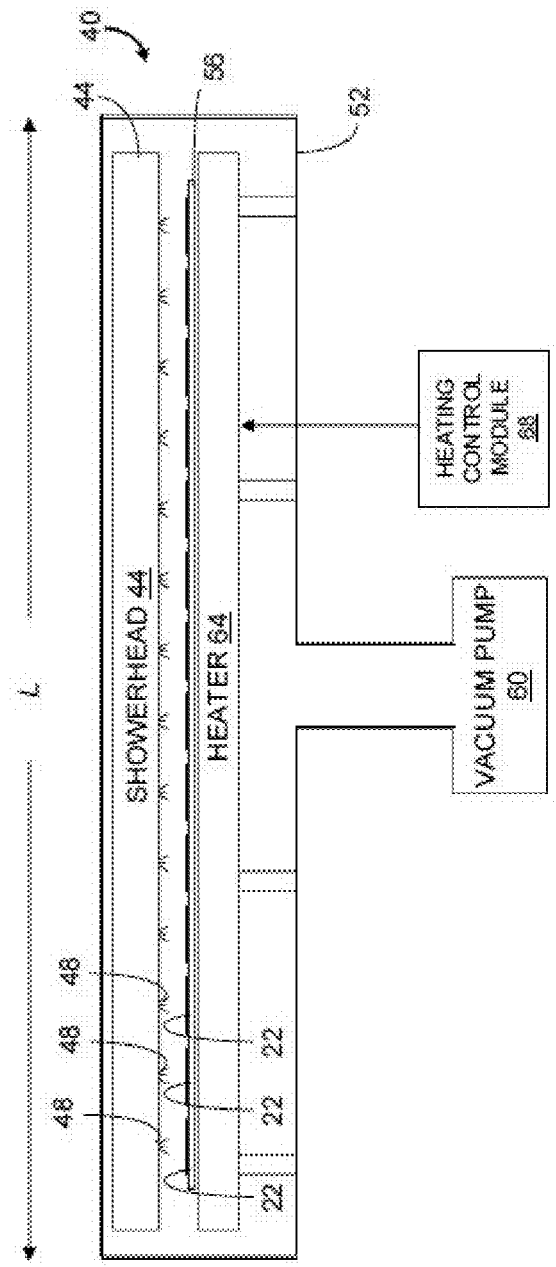

SHOWERHEAD APPARATUS FOR A LINEAR BATCH CHEMICAL VAPOR DEPOSITION SYSTEM

RELATED APPLICATION

This application is a continuation-in-part application of U.S. patent application Ser. No. 12/787,082, titled "Linear Batch Chemical Vapor Deposition System" and filed May 25, 2010.

FIELD OF THE INVENTION

The invention relates generally to a system and method for chemical vapor deposition. More particularly, the invention relates to a chemical vapor deposition system having a showerhead apparatus for linear batch processing of substrates.

BACKGROUND OF THE INVENTION

Chemical vapor deposition (CVD) is a process frequently used to deposit semiconductor, dielectric, metallic and other thin films onto a surface of a substrate. In one common CVD technique, one or more precursor molecules, each in a gas phase, are introduced into a process chamber that includes the substrate. The reaction of these precursor gases at the surface of the substrate is initiated or enhanced by adding energy. For example, energy can be added by increasing the surface temperature of the substrate or by exposing the surface to a plasma discharge or ultraviolet (UV) radiation source.

The quality of a film deposited by a CVD reaction occurring in the gas phase depends significantly on the uniformity of the precursor gases at the substrate. Non-uniform gas near the substrate surface can yield unsatisfactory film uniformity and can lead to shadowing artifacts due to features on the surface, such as steps and vias. High volume processing of wafers and other substrates is limited by known systems and methods for CVD processing. Complex rotational mechanisms are often employed and the size of conventional reaction chambers limits the number of substrates per CVD process batch.

SUMMARY OF THE INVENTION

In one aspect, the invention features a showerhead apparatus that includes a showerhead, a gas supply conduit and a translation mechanism. The showerhead has a conduit to conduct a precursor gas along a length of the showerhead. The showerhead also has a channel along a surface of the showerhead disposed parallel to the length. At least one opening between the conduit and the channel enables the supply of the precursor gas from the conduit to the channel. An end of the gas supply conduit is in communication with the conduit of the showerhead and an opposite end of the gas supply conduit is configured to receive the precursor gas. The translation mechanism is in communication with the showerhead and is configured to translate the showerhead in a forward motion and a reverse motion in a direction that is perpendicular to the length of the showerhead. The precursor gas received at the gas supply conduit is provided along a length of the channel.

In another aspect, the invention features a showerhead apparatus that includes a movable showerhead body, first and second gas supply conduits, a translation mechanism and a stationary showerhead body. The movable showerhead body has a conduit to conduct a first precursor gas along a length of the movable showerhead body, a channel along a surface of the movable showerhead body that is disposed parallel to the length, and at least one opening between the conduit and the channel to supply the first precursor gas from the conduit to the channel. The first gas supply conduit has an end in communication with the conduit of the movable showerhead body and an opposite end configured to receive the first precursor gas. The translation mechanism is in communication with the movable showerhead body and is configured to translate the movable showerhead body in a forward motion and a reverse motion in a direction that is perpendicular to the length of the movable showerhead body. The stationary showerhead body has at least one conduit to conduct a second precursor gas inside the stationary showerhead body and a plurality of openings between the at least one conduit and a surface of the stationary showerhead body to thereby supply the second precursor gas from the stationary showerhead body. The second gas supply conduit has an end in communication with the at least one conduit of the stationary showerhead body and an opposite end configured to receive the second precursor gas.

BRIEF DESCRIPTION OF THE DRAWINGS

The above and further advantages of this invention may be better understood by referring to the following description in conjunction with the accompanying drawings, in which like numerals indicate like structural elements and features in the various figures. For clarity, not every element may be labeled in every figure. The drawings are not necessarily to scale, emphasis instead being placed upon illustrating the principles of the invention.

FIG. 3A and FIG. 3B show a top view and a side view, respectively, of one embodiment of a linear batch CVD system according to the invention.

DETAILED DESCRIPTION

The present teaching relates to systems and methods for reactive gas phase processing such as CVD, MOCVD and Halide Vapor Phase Epitaxy (HVPE) processes. In conventional reactive gas phase processing of semiconductor materials, semiconductor wafers are mounted in a carrier inside a reaction chamber. A gas distribution injector is configured to face the carrier. The injector typically includes gas inlets that receive a plurality of gases or combinations of gases. The injector directs the gases or combination of gases to the reaction chamber. Injectors commonly include showerhead devices arranged in a pattern that enables the precursor gases to react as close to each wafer surface as possible to maximize the efficiency of the reaction processes and epitaxial growth at the surface.

Some gas distribution injectors include a shroud to assist in providing a laminar gas flow during the CVD process. One or more carrier gases can be used to assist in generating and maintaining the laminar gas flow. The carrier gases do not react with the precursor gases and do not otherwise affect the CVD process. A typical gas distribution injector directs the precursor gases from the gas inlets to targeted regions of the reaction chamber where the wafers are processed. For example, in some MOCVD processes the gas distribution injector introduces combinations of precursor gases including metal organics and hydrides into the reaction chamber. A carrier gas such as hydrogen or nitrogen, or an inert gas such as argon or helium, is introduced into the chamber through the injector to help sustain a laminar flow at the wafers. The precursor gases mix and react within the chamber to form a film on the wafers.

In MOCVD and HVPE processes, the wafers are typically maintained at an elevated temperature and the precursor gases are typically maintained at a lower temperature when introduced into the reaction chamber. The temperature of the precursor gases and thus their available energy for reaction increases as the gases flow past the hotter wafers.

Figure 1:
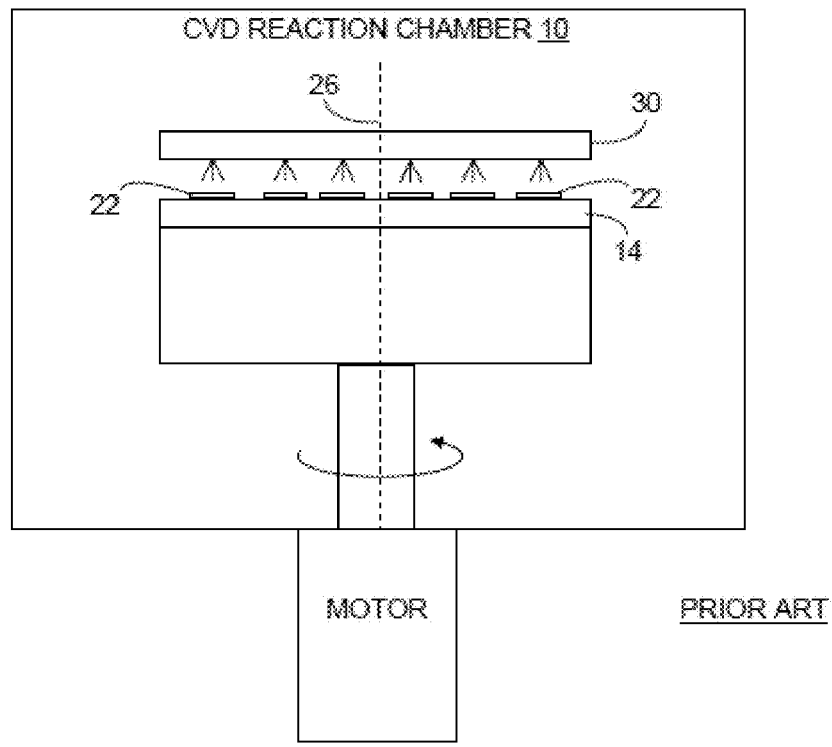
FIG. 1 is an illustration of a CVD reaction chamber as is known in the art.
Figure 2:
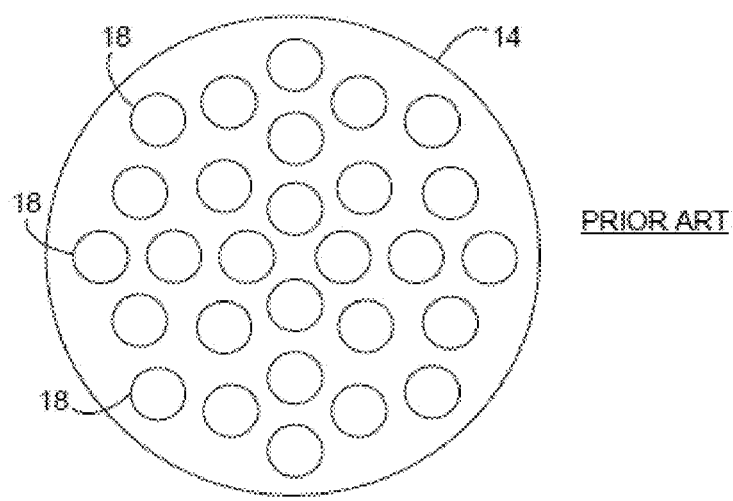
FIG. 2 is an illustration of the wafer carrier of FIG. 1.

One common type of CVD reaction chamber 10 is shown in FIG. 1. The chamber 10 includes a disc shaped wafer carrier 14 shown in an unpopulated state in more detail in FIG. 2. The carrier 14 has pockets 18 or other structural features arranged to hold one or more wafers 22 on a top surface. During CVD processing, the carrier 14 rotates about a vertical axis (dashed line 26) that extends perpendicular to the wafer-bearing surface and each wafer 22 is rotated about a wafer axis that is centered on and perpendicular to the wafer surface to achieve planetary motion. Rotation of the carrier 14 and wafers 22 improves the uniformity of the deposited material. During rotation, the precursor gases are introduced into the reaction chamber 10 from a flow inlet element 30 above the carrier 14. The flowing gases pass downward toward the wafers 22, preferably in a laminar plug flow. As the gases approach the rotating carrier 14, viscous drag impels the gases into rotation about the axis 26. Consequently, in a boundary region near the carrier surface and wafers 22, the gases flow around the axis 26 and outward toward the edge of the carrier 14. The gases flow past the carrier edge and then downward toward one or more exhaust ports. Typically, MOCVD process are performed using a succession of different precursor gases and, in some instances, different wafer temperatures, to deposit a plurality of different layers each having a different composition to form a device.

CVD processes are typically limited in batch capacity. For example, achieving uniformity of the deposited film for all substrates in a conventional CVD reaction chamber (e.g., chamber 10 in FIG. 1) is generally difficult, especially as the size of the reaction chamber increases to allow for more substrates to be processed or to accommodate larger substrates. Conventional systems and methods for CVD processing are often inadequate to support high volume processing of wafers and other substrates without sacrificing uniformity of the deposited films or requiring redundant equipment.

The systems and methods of the present invention are suitable for high volume batch CVD processing of substrates. The narrow width of the reaction chamber of the systems enables a uniform distribution of the precursor gases across the substrates along the entire length of the chamber. The number of substrates that can be coated with uniform film thickness and composition during a single CVD process run is scalable and can be substantially larger than the number of substrates processed in a typical CVD reaction chamber. Moreover, complicated motion mechanisms are not required and each substrate is simply rotated about a single substrate axis.

FIG. 3A and FIG. 3B are top and side views, respectively, of an embodiment of a linear batch CVD system 40 according to the present invention. In FIG. 3A, the top down view is from underneath a shower head 44 structure that includes gas injectors 48 as shown in FIG. 3B. The linear batch CVD system 40 includes a deposition chamber 52, substrate carrier 56, vacuum system 60, the shower head 44 and a heating system that includes a heater 64 and a heating control module 68. The substrate carrier 56 includes a plurality of receptacles 72 each configured to receive a substrate 22. In the embodiments describe herein, the substrate 22 is generally described as a wafer, such as a semiconductor wafer; however, it should be recognized that other forms and types of substrates can be used.

The width W of the deposition chamber 52 is substantially narrower than the length L and accommodates only a single row of wafers 22. Although the row is shown as a straight line, the invention contemplates other types of rows in which the wafers 22 are arranged in a curved line or other shape so that the dimension perpendicular to the row at any location is substantially less than the length of the row. For example, the linear configuration can include a batch of wafers 22 arranged along a straight line, a curved line, or any combination of straight line segments and curved line segments. The narrow dimension of the configuration enables a uniform distribution of precursor gases across all the wafers 22 in the batch.

In preparation for a CVD process run, wafers 22 are loaded into respective receptacles 72 in the substrate carrier 56. Loading is preferably performed in an automated manner, for example, by retrieving the wafers 22 from a wafer supply and positioning each wafer 22 into its receptacle 72 using one or more robotic mechanisms disposed near one side of the deposition chamber 52. Similarly, processed wafers 22 can be removed from the receptacles using robotic means.

Figure 4A:
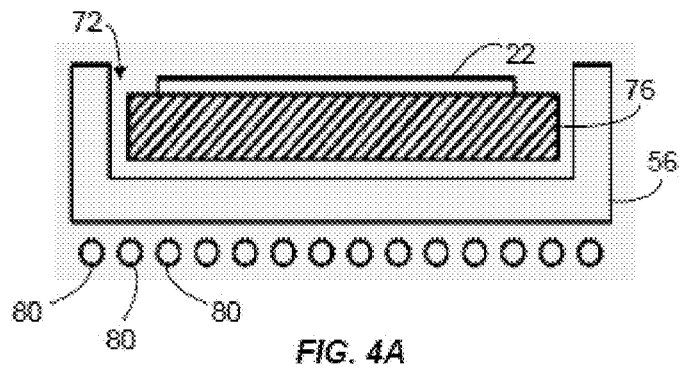
FIG. 4A shows a cross-sectional view through one of the receptacles of the substrate carrier of FIG. 3A and FIG. 3B.

FIG. 4A is a cross-sectional view of the substrate carrier 56 through one of the receptacles 72. Each receptacle 72 includes a recessed region to maintain the position of the wafers 22 within the carrier 56. As illustrated, the wafer 22 is disposed on an intermediate substrate carrier 76 that resides in the receptacle 72. The heater 64 includes a plurality of heating elements 80 positioned near the bottom of the substrate carrier 56 and arranged substantially parallel to the length of the carrier 56. For example, the heating elements 80 may be wires or filament heaters that generate heat while conducting an electrical current. Alternatively, the heating elements 80 may be lamp heaters or RF heaters.

Heat is coupled from the heating elements 80 to the substrate carrier 56 via radiative coupling. In one embodiment, the substrate carrier 56 comprises graphite or another material having a high thermal conductivity to efficiently conduct heat to the wafers 22. Preferably, the heating elements 80 are independently controlled, or are controlled as subsets of the total number of elements. Individual element control or group control allows temperature variations due to radiation loss from the sides of the substrate carrier 56 to be compensated by applying greater heat near the sides of the carrier 56. In an alternative embodiment, the heating elements 80 do not extend the length of the carrier 56, but are instead arranged in zones of shorter lengths that together span nearly the full length of the deposition chamber. The shorter heating zones may be independently controlled in response to temperature measurements at different locations along the length of the deposition chamber to achieve a more uniform temperature environment.

Figure 4B:
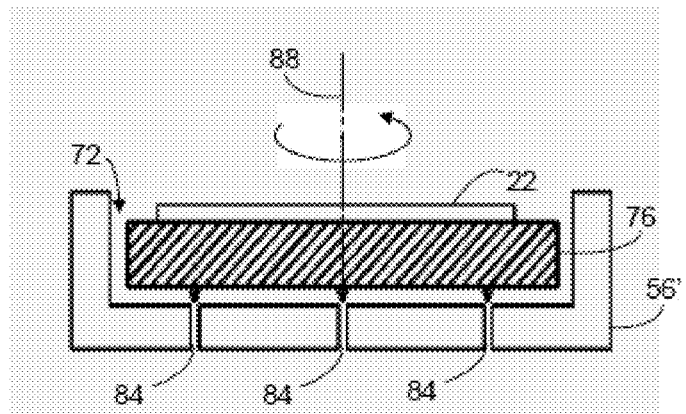
FIG. 4B shows a cross-sectional view of an alternative substrate carrier according to another embodiment of the invention.
Figure 4C:
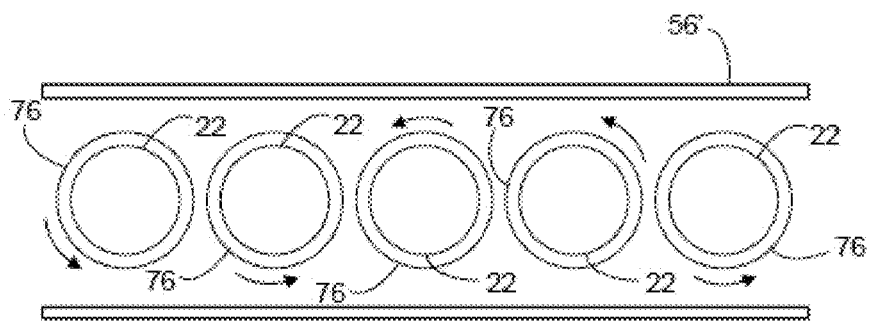
FIG. 4C is a top view of the substrate carrier of FIG. 4B showing rotation of the wafers about a substrate axis.

FIG. 4B illustrates a cross-sectional view of a substrate carrier 56' according to another embodiment. Each receptacle 72 in the substrate carrier 56' has a plurality of air injector channels 84 that, when active, allow gas to flow upward to provide an air bearing support that floats the intermediate substrate carrier 76 and wafer 22. At least some of the air injector channels 84 in each receptacle 72 are configured at a non-zero angle with respect to the vertical axis 88 to impart a rotation to the intermediate substrate carrier 76 about the vertical axis 88 so that each intermediate carrier 76 and wafer 22 rotate as shown in FIG. 4C.

Referring again to FIG. 3B, in various embodiments the CVD system 40 includes one or more sensors to sense the temperature across the wafers. Temperature sensors communicate with the heating control module 68 to enable more accurate control of the wafer temperatures. The temperature sensor can be a pyrometer or other sensor adapted for determining the high temperatures of the wafers 22 during the CVD process. Alternatively, one or more thermocouples disposed on the substrate carrier 56 communicate with the heating control module 68 to provide a feedback signal to enable accurate control of the wafer temperatures.

In another embodiment, the CVD system 40 includes one or more film thickness sensors to determine the thickness of the films being deposited on the wafers 22. The film thickness sensor can be an optical reflectometer or similar measurement system as known in the art.

A temperature sensor and film thickness sensor can be integrated in a single measurement head used to monitor conditions during a CVD process. In one embodiment, a plurality of measurement heads are positioned along the length L of the deposition chamber 52 to obtain temperature and thickness data for a subset of the total number of wafers 22, for example, the measurement heads can be positioned to obtain data for every third wafer 22 in the linear configuration. In an alternative embodiment, a single measurement head having a temperature sensor and a film thickness sensor is mounted to a translation mechanism, such as a linear drive, that enables the measurement head to be moved along the length L of the deposition chamber 52. A window above each wafer 22 enables the moving head to obtain data for each wafer 22. The wafer measurements are used to control the heater 64 and the precursor gas flows.

The showerhead 44 provides a uniform distribution of the precursor gases at the surface of each wafer 22. In a two precursor gas system, the showerhead 44 includes one or more gas injectors for each precursor gas. By way of an example, the precursor gases in a two precursor gas implementation can include trimethylgallium (TMG) and ammonia gases used in the production of gallium nitride (GaN) light-emitting diodes (LEDs).

In some CVD applications where film growth is determined by surface reactions, it is preferable to sequentially activate, or pulse, the precursor gases so that substantially only one gas is present in the deposition chamber 52. Pulsing of the precursor gases in this manner limits the mixing of the gases in the chamber and reduces or eliminates parasitic deposition.

Figure 5:
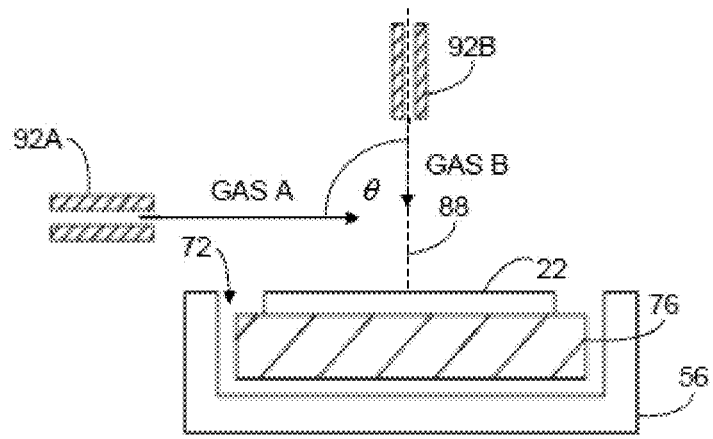
FIG. 5 is a cross-sectional view through a wafer and substrate carrier showing a side view of two injector ports arranged in a perpendicular configuration according to one embodiment of the invention.

FIG. 5 is a cross-sectional view through a receptacle 72 and wafer 22 showing a side view of two injector ports (slots 92 extending into page) arranged in a perpendicular configuration ($\theta=90°$) according to one embodiment. One slot 92A provides a precursor gas (gas "A") in a horizontal flow that is substantially parallel to the wafer surface. The other slot 92B provides a different precursor gas (gas "B") in a vertical flow that is substantially parallel to the axis 88 of the wafer 22. In alternative embodiments, the angle theta between the injector slots 92 is configured to be at a different value in a range from $\theta=0°$ (side by side horizontal flow configuration) to $\theta=90°$.

Figure 6:
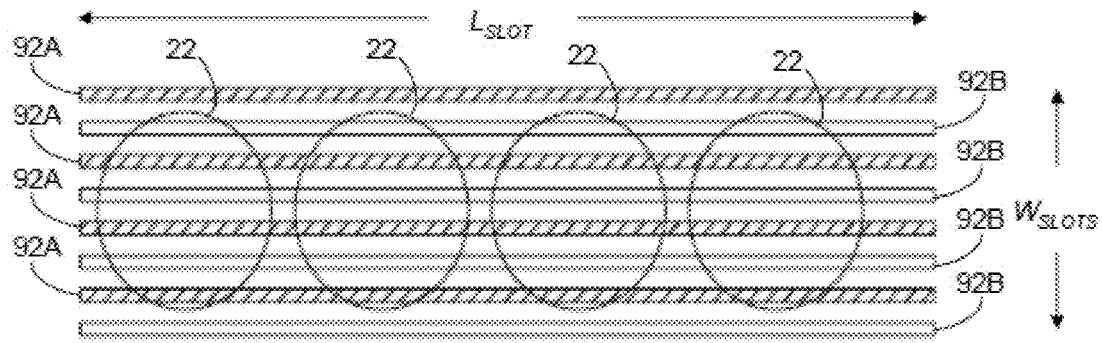
FIG. 6 shows a top view of an arrangement of injector ports according to one embodiment of the invention.

FIG. 6 shows a top view of an arrangement of injector ports 92 with respect to four adjacent substrates 22 according to another embodiment. Each injector port 92 is in the form of a slot, or substantially rectangular opening, and has a length $L_{SLOT}$ that extends parallel to the length L of the deposition chamber 52 (see FIG. 3A). The width $W_{SLOTS}$ of the full arrangement of slots 92 is greater than the diameter of the substrates 22. Precursor gas A is supplied from slots 92A that are spaced in alternating arrangement with slots 92B that supply precursor gas B.

In one embodiment, the lengths $L_{SLOT}$ of the slots 92 are nearly as long as the length of the deposition chamber. In alternative embodiments, the slots 92 are configured in two or more groups so that the lengths $L_{SLOT}$ of the slots 92 in a group is substantially less than the length of the deposition chamber. Injector port grouping is preferable in some configurations having a high batch capacity to enable more uniform precursor gas distribution across the narrow dimension of the deposition chamber. By way of example, the lengths $L_{SLOT}$ of slots in a group can be one meter for a deposition chamber that is several meters in length. In some embodiments, the spacing between adjacent wafers 22 in neighboring groups may exceed the spacing between wafers 22 within the same port group. The precursor gas flows for each group can be independently controlled to enable more uniform deposition of films for the full batch of wafers 22 in the deposition chamber.

Figure 7:
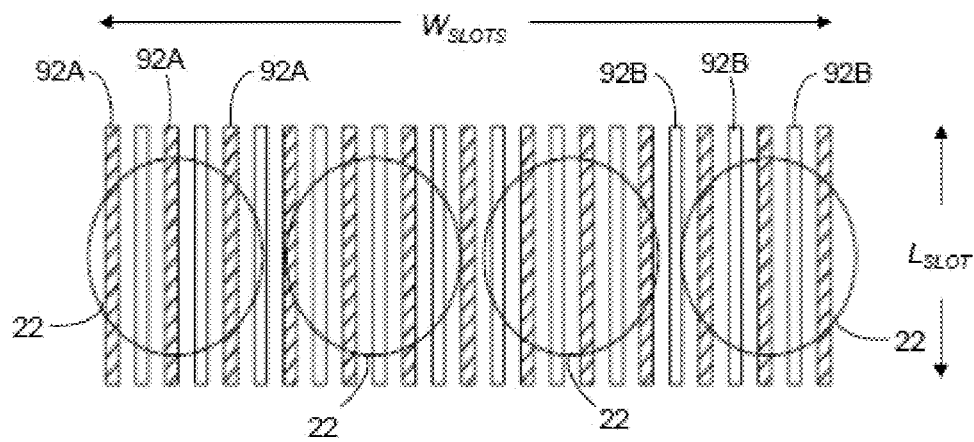
FIG. 7 shows a top view of an arrangement of injector ports according to another embodiment of the invention.

FIG. 7 shows a top view of an alternative embodiment to the slots 92 illustrated in FIG. 6. Each slot 92 has a length $L_{SLOT}$ that extends parallel to the shorter dimension (i.e., the width W shown in FIG. 3A) of the deposition chamber and is greater than the diameters of the wafers 22. The slots 92A and 92B are arranged in alternating position along the length of the deposition chamber. In one embodiment, the full width $W_{SLOTS}$ of the configuration of slots 92 is nearly the length of the deposition chamber. In some alternative embodiments, the slots 92 are arranged in groups each having a group width that is substantially less than the length of the deposition chamber. The spacing between adjacent wafers 22 belonging to neighboring slot groups can exceed the spacing between wafers 22 within a slot group. The gas flow for injector ports in the slot groups can be independently controlled to improve the uniformity of film deposition for all wafers 22 in the deposition chamber.

Figure 8A:
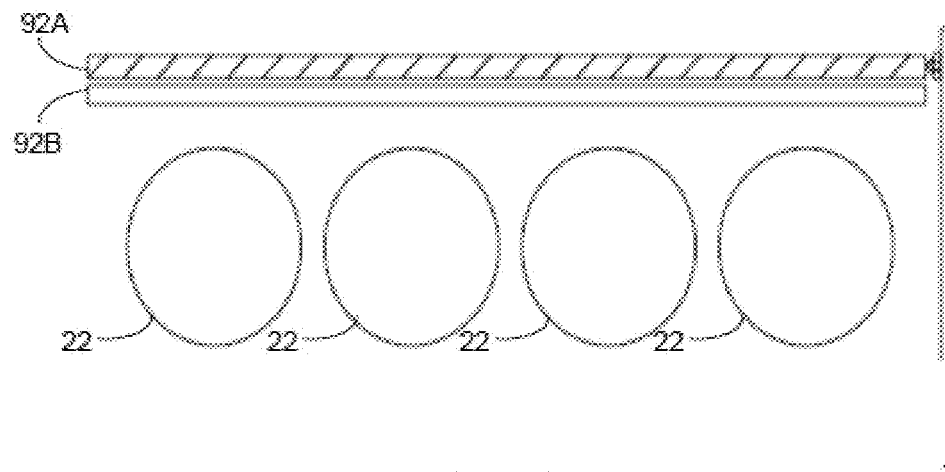
FIG. 8A, FIG. 8B and FIG. 8C show top views of an arrangement of injector ports at various positions according to another embodiment of the invention.
Figure 8B:
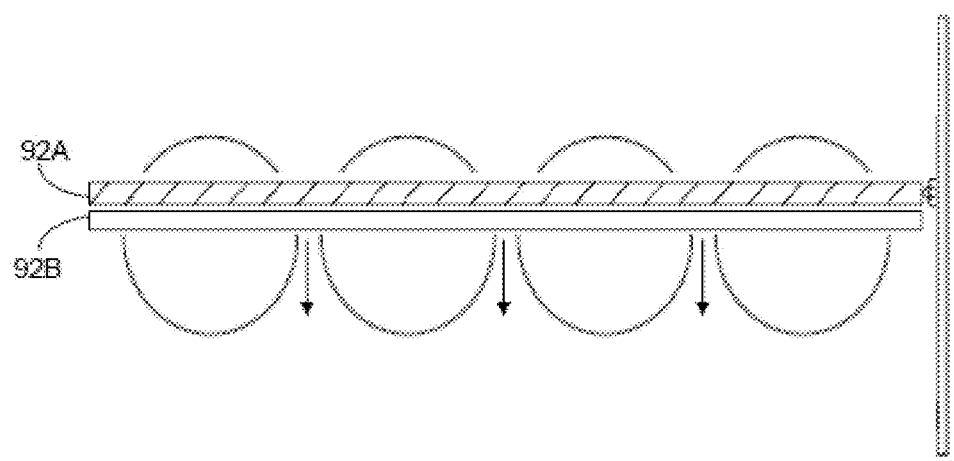
Figure 8C:
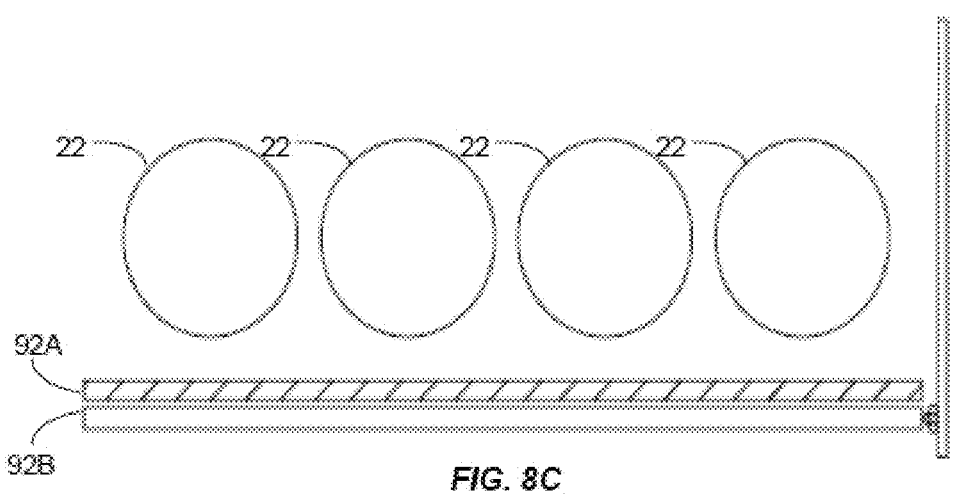

For the gas injector configurations described above, each precursor gas is supplied to the deposition chamber through multiple ports. FIG. 8A shows an alternative configuration in which a single pair of injector ports (i.e., a "port pair") includes one slot 92A to supply precursor gas A and a second slot 92B to supply precursor gas B. During a CVD process run, the port pair is swept in a back and forth motion above the wafers 22 using a translation mechanism such as a single-axis translation stage. For example, the port pair moves from one side of the row of wafers 22 as shown in FIG. 8A, through intermediate positions (for example, as shown in one intermediate position in FIG. 8B), until it reaches a position at the opposite side of the row of wafers 22 as shown in FIG. 8C. The port pair is then translated in a reverse direction until it returns to the position shown in FIG. 8A. The motion of the port pair is repeated in a cyclical manner throughout the CVD process run.

Figure 9:
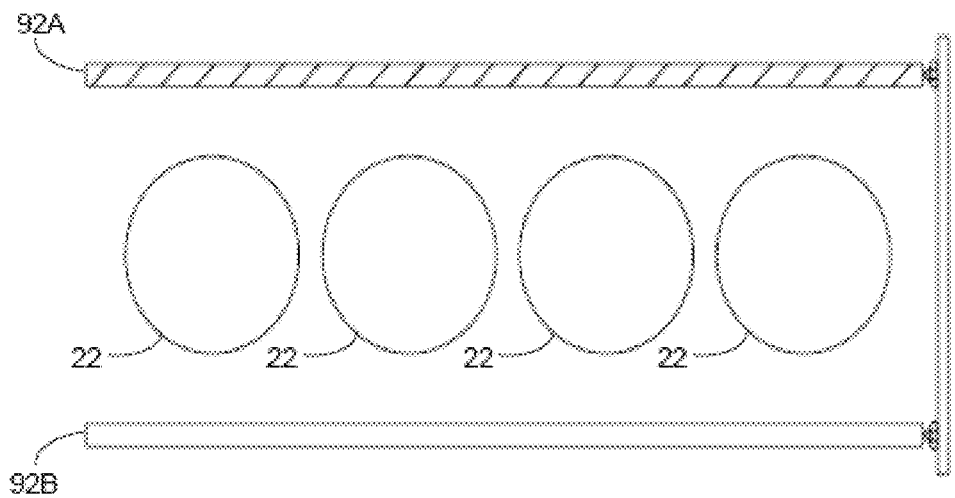
FIG. 9 shows a configuration of injector ports according to another embodiment of the invention.

FIG. 9 shows a configuration of gas injectors according to another embodiment in which one slot 92A that supplies precursor gas A is on an opposite side of the row of wafers 22 from another slot 92B that supplies precursor gas B. During a CVD process run the first slot 92A moves from the illustrated position across the row of wafers 22 until it is adjacent to the second slot 92B. The first slot 92A then translates in a reverse direction until it returns to the illustrated position. The second slot 92B remains stationary when the first slot 92A is in motion.

Once the first slot 92A completes its round trip motion, the second slot 92B is moved from its illustrated position across the row of wafers 22 until it is adjacent to the first slot 92A. The second slot 92B then reverses direction and moves across the wafers 22 until it reaches its illustrated position. The first slot 92A remains stationary while the second slot is in motion. This alternating motion in which the first slot 92A moves and then the second slot 92B moves is repeated throughout the CVD process. In a preferred embodiment, the two precursor gases supplied by the slots 92 are sequentially pulsed so that gas is supplied from a slot only when the slot is in motion so that parasitic deposition is substantially reduced.

Other variations of the phasing of the cyclic motions of the two slots 92 will be apparent to those of skill in the art. For example, one slot 92 may begin its motion before the other slot 92 completes its motion as long as the slots do not interfere with each other.

In the various embodiments described above with respect to FIG. 5 to FIG. 9, the gas injectors include ports 92 that are substantially rectangular or slotted; however, other forms of gas injectors are contemplated. For example, the gas injectors can be in the form of injector tubes uniformly distributed over the substrate carrier 56. Ports can be any of a variety of openings such as holes or various shaped apertures through a sidewall of the tube facing the substrate carrier 56.

Figure 10:
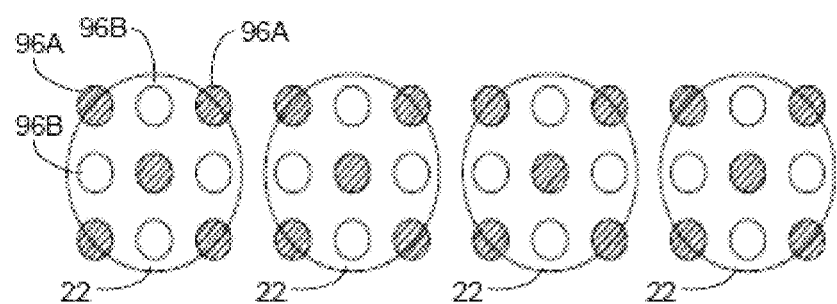
FIG. 10 shows a top view of injector nozzles according to one embodiment of the invention.

FIG. 10 is a top view relating to another embodiment and shows a configuration of injector nozzles 96 with respect to four adjacent wafers 22. The number of nozzles 96 above each wafer 22 may be different and only nine nozzles are shown with each wafer 22 for clarity. Some nozzles 96A supply a first precursor gas (e.g., gas A) and the other nozzles 96B supply a second precursor gas (e.g., gas B) so that a substantially uniform distribution of each gas is present near and at the surface of each wafer 22. In some embodiments, the nozzles 96 are controlled in subsets, or groups, defined for zones for subsets of the total number of wafers 22 arranged along the length of the deposition chamber.

Figure 11:
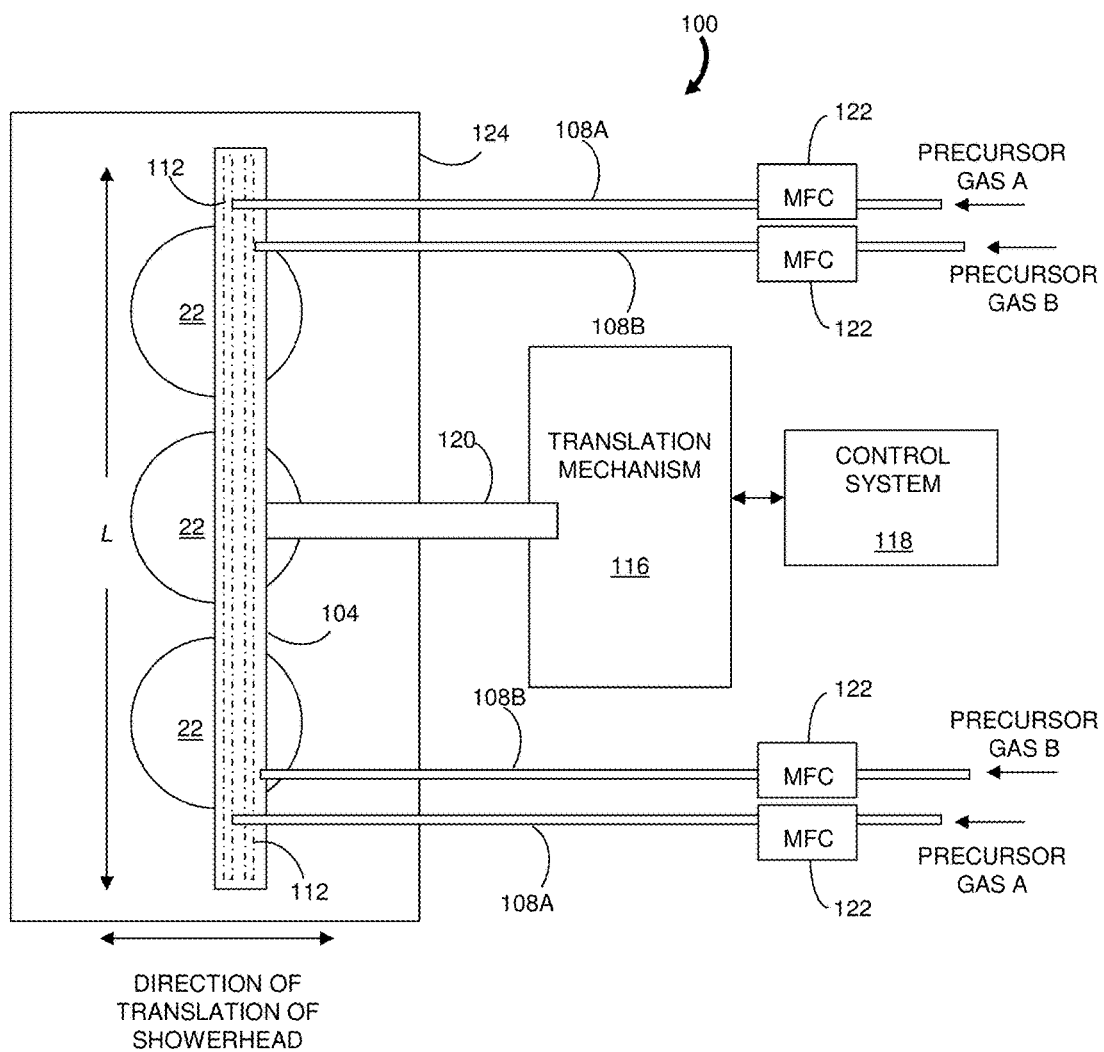
FIG. 11 is a schematic block diagram of an embodiment of a showerhead apparatus that can be used in a linear batch CVD system.

FIG. 11 is a schematic block diagram of an embodiment of a showerhead apparatus 100 that can be used in a linear batch CVD system such as the CVD system of FIG. 3A and FIG. 3B. The apparatus 100 includes a movable showerhead 104, one or more pairs of gas supply conduits 108, and a translation mechanism 116 such as a single-axis translation stage. Each gas supply conduit 108 is configured at one end for direct or indirect coupling to a source of a precursor gas. The other end of each gas supply conduit 108 is in communication with one end of an internal conduit (dashed lines 112), i.e., "showerhead conduit", inside the body of the showerhead 104. In various embodiments, the flow of gas through the gas supply conduits 108 includes the precursor gas and a carrier gas.

The showerhead conduits 112 conduct the precursor gases along the length L of the showerhead 104. Openings, such as slots or linear arrangements of holes, allow the precursor gases to pass from the showerhead conduits 112 through channels along the bottom surface of the showerhead 104. The channels are separated from the top of the wafers 22 by a small distance such that the precursor gas flows from the channels are directed onto only a small portion of each wafer 22 beneath the showerhead 104.

The translation mechanism 116 is coupled to the showerhead 104 by a rigid structure 120. During a deposition process run, the translation mechanism 116 causes the showerhead 104 to move across the wafers 22 in a direction perpendicular to the linear arrangement of the wafers 22. After traversing the full diameter of the wafers 22 and an additional "buffer distance" beyond the wafer edge, the translation mechanism 116 causes the showerhead 104 to reverse direction and move across the wafers 22 and through another buffer distance beyond the far wafer edge. Precursor gases are only able to interact in a small region at the wafers 22 that is below the showerhead 104 as it sweeps back and forth. Thus parasitic deposition throughout the deposition chamber 124 is substantially reduced in comparison to a conventional showerhead apparatus.

In other embodiments, one of the precursor gases is introduced into the deposition chamber 124 by a larger stationary showerhead separated by a greater distance from the wafers 22. Although the precursor gas from the stationary showerhead may be present throughout a substantial volume of the deposition chamber 124, the region of interaction with the precursor gas from the movable showerhead 104 is limited and therefore parasitic deposition is similarly limited.

The ability to precisely control the precursor gas flows and motion of the movable showerhead 104 allows for improved thickness uniformity and device yield. The velocity of the showerhead 104 can be controlled to fine tune the thickness along the direction of travel of the movable showerhead 104 to thereby achieve improved thickness uniformity. Gas flow controllers, such as mass flow controllers MFC 122, enable the gas velocities through the gas supply conduits 108 to be controlled. Thus the deposition thickness along a direction perpendicular to the direction of travel of the movable showerhead 104 can be adjusted. For example, if the thickness of the deposited layer is determined in-situ to be less near the middle of the length L of the deposition chamber 124, the velocity of the precursor gases in the gas supply conduits 108 can be increased. Conversely, if the thickness of the deposited layer is determined to be greater near the middle of the length L, the precursor gas velocities in the gas supply conduits 108 can be decreased. Advantageously, the wafers 22 are not required to rotate and wafers can be constrained within their carriers to reduce or eliminate stress and warping. Interior walls and components within the deposition chamber 124 remain cleaner.

More detailed embodiments of showerhead apparatus, such as the apparatus 100 of FIG. 11, are described below.

Figure 12A:
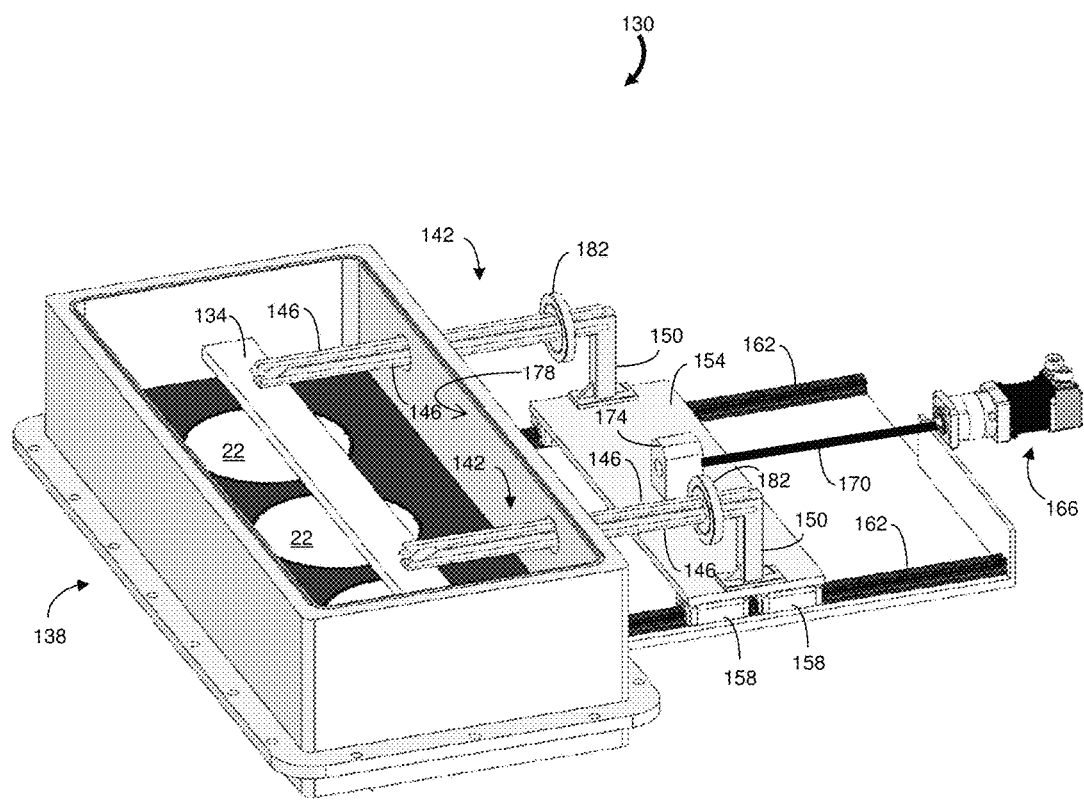
FIGS. 12A, 12B and 12C are a perspective view, top view and side view, respectively, of a portion of a linear batch CVD system having a showerhead apparatus according to the invention.
Figure 12B:
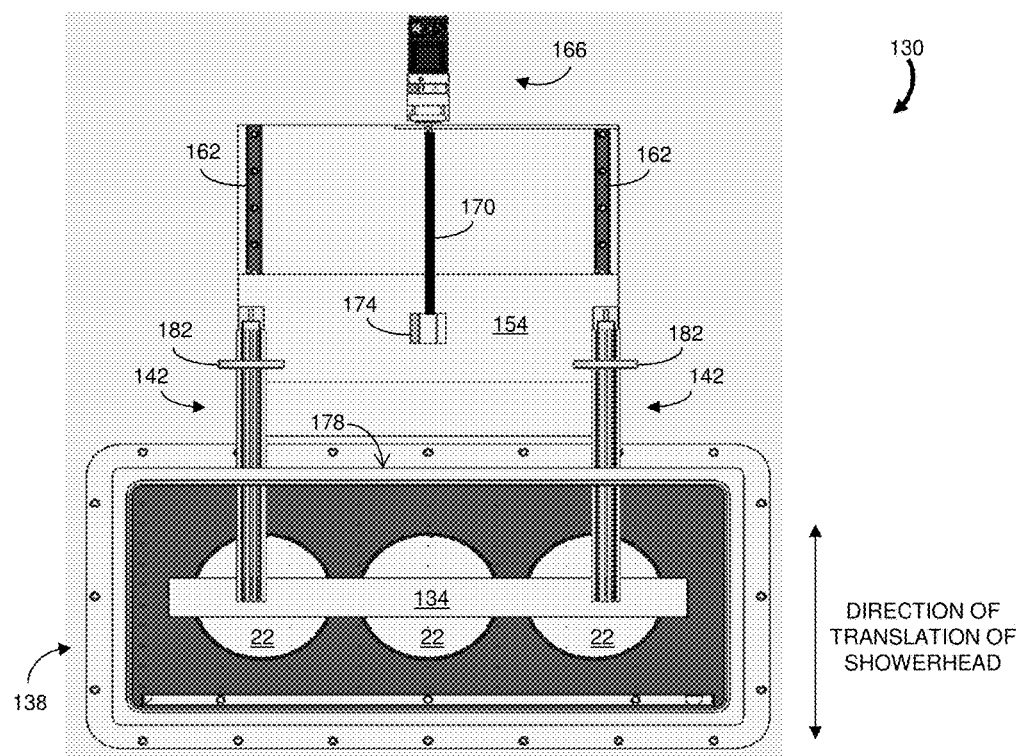
Figure 12C:
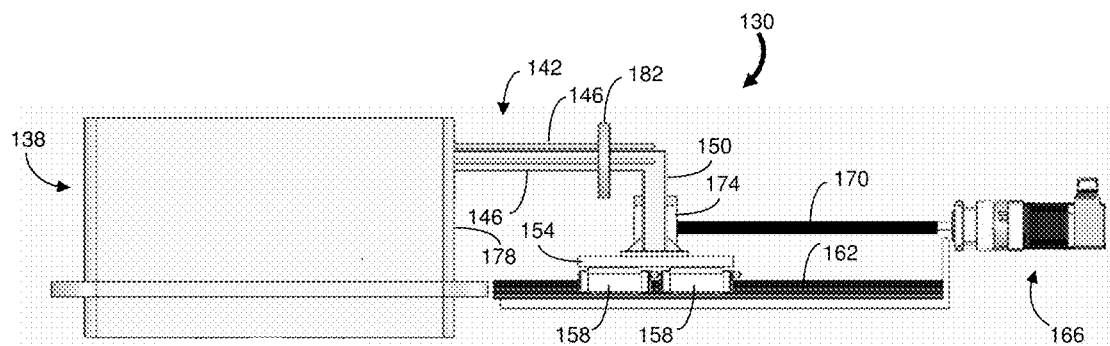

FIG. 12A is a perspective view of a portion of an embodiment of a linear batch CVD system 130. FIG. 12B and FIG. 12C show a top view and a side view, respectively, of the portion of the CVD system 130. The CVD system 130 includes a movable showerhead 134 for providing a flow of precursor gases to a linear arrangement of wafers 22. The deposition chamber 138 is shown with the top removed so that the wafers 22 and showerhead 134 are visible. Although shown for clarity with only three wafers 22, in other embodiments other numbers of substrates are accommodated in a linear arrangement within the deposition chamber 138.

The showerhead 134 is fixed to one end of a pair of rigid structures 142. Gas supply conduits 146 (e.g. tubes) are secured to each rigid structure, or arm, 142 and extend along the length of the arm 142 to supply the precursor gases, and any carrier gas, to the showerhead 134. The other end of each arm 142 is fixed to the top of a vertical bracket 150 which is secured to a top side of a mounting plate 154. In some embodiments the arm 142 and vertical bracket 150 are integrated as a single rigid structure. The ends of the gas supply conduits 146 furthest from the showerhead 134 are configured for coupling to one or more precursor gas sources. Mass flow controllers (not shown) are preferably included between the gas supply conduits 146 and the precursor gas sources to allow the flow of precursor gas and any carrier gas. Flexible tubes (not shown) are used to conduct the flow of precursor gases from the gas sources and mass flow controllers to the gas supply conduits 146. In one embodiment, the gas supply conduits 146 are also flexible tubes. In other embodiments, one or more of the gas supply conduits 146 is a flexible tube that couples directly to a precursor gas source or mass flow controller. Each gas supply conduit 146 can conduct a different precursor gas and optional carrier gas.

Carriers 158 attached to the bottom side of the mounting plate 154 engage a pair of linear rails 162. The carriers 158 and rails 162 allow the structure comprising the showerhead 134, arms 142, vertical bracket 150 and mounting plate 154 to move horizontally in a direction parallel to the length of the rails 162. A DC servo motor 166 is secured in position near the ends of the linear rails 162 and is coupled via a lead screw 170 to a drive bracket 174 on the upper surface of the mounting plate 154.

The DC servo motor 166 is activated to rotate in one direction and thereby "push" the mounting plate 154 toward the deposition chamber 138. This motion causes the showerhead 134 to move across the deposition chamber 138 away from the motor 166. When the rotation direction of the motor 166 is reversed, the mounting plate 154 is "pulled" toward the motor 166 so that the showerhead 134 moves back across the deposition chamber 138 and toward the motor 166. The range of rotation of the motor 166 (i.e., the number of turns in each direction) is controlled so that the showerhead 134 moves from a first position beyond one edge of the wafers 22 to a second position beyond the diametrically opposite side of the wafers 22 and then back to the first position. This motion is repeated multiple times during a process run. While the showerhead 134 traverses above the wafers 22, the motor 166 turns at a constant rate to maintain a substantially constant translation rate for the showerhead 134 although the translation rate may be controlled to deviate from a constant rate to adjust for thickness non-uniformity determined from in-situ measurement of the thickness of the deposited layer. When the showerhead 134 approaches either end of its range of travel, the translation rate decelerates to zero and then accelerates for motion in the opposite direction until attaining a constant translation rate or attaining a translation rate profile for achieving thickness uniformity in the direction of travel. The initial translation rate can be selected according to a variety of factors, such as the type of precursor gases being used and the thickness of the incremental growth layers. The range of travel is selected so that the turnaround locations are well beyond the edge of the wafers 22. Consequently, the non-uniformity of the deposition thickness on the wafers 22 that would otherwise result from the variation in the translation rate during turnaround is avoided. Various techniques can be used to measure the growth rate of the films in-situ. A device for measuring the thickness of a deposited layer, such as an optical thickness measurement device, can be used to monitor the thickness and/or growth rate of the deposited layer. The measurement device can provide data or a signal indicating the growth rate to a control system (e.g., control system 118 in FIG. 11) of the apparatus to control the speed, acceleration and deceleration of the showerhead 134 to precisely tune the deposition thickness.

As the showerhead 134 moves back and forth over the wafers 22, the arms 142 move back and forth through the deposition chamber wall 178. The motion of the arms 142 is accommodated by a pair of bellows (not shown) so that the internal vacuum environment of the deposition chamber 138 is maintained. Each bellows substantially surrounds a portion of the length of an arm 142 and extends from the outer surface of the deposition chamber wall 178 to a disk 182 near the end of the respective arm 142 closest to the vertical bracket 150. In alternative embodiments, a ferrofluidic rotary feedthrough in conjunction with a cam device or a differentially pumped sliding seal are used to maintain the internal vacuum during the translation of the showerhead 134.

Although the illustration shows the showerhead 134 having a length that extends over three wafers 22, in other embodiments the length can differ. By way of a non-limiting example, the length of the showerhead 134 can be 30 inches and the minimum distance between the upper surface of the wafers 22 and the showerhead 134 can be 0.5 inch.

Figure 13A:
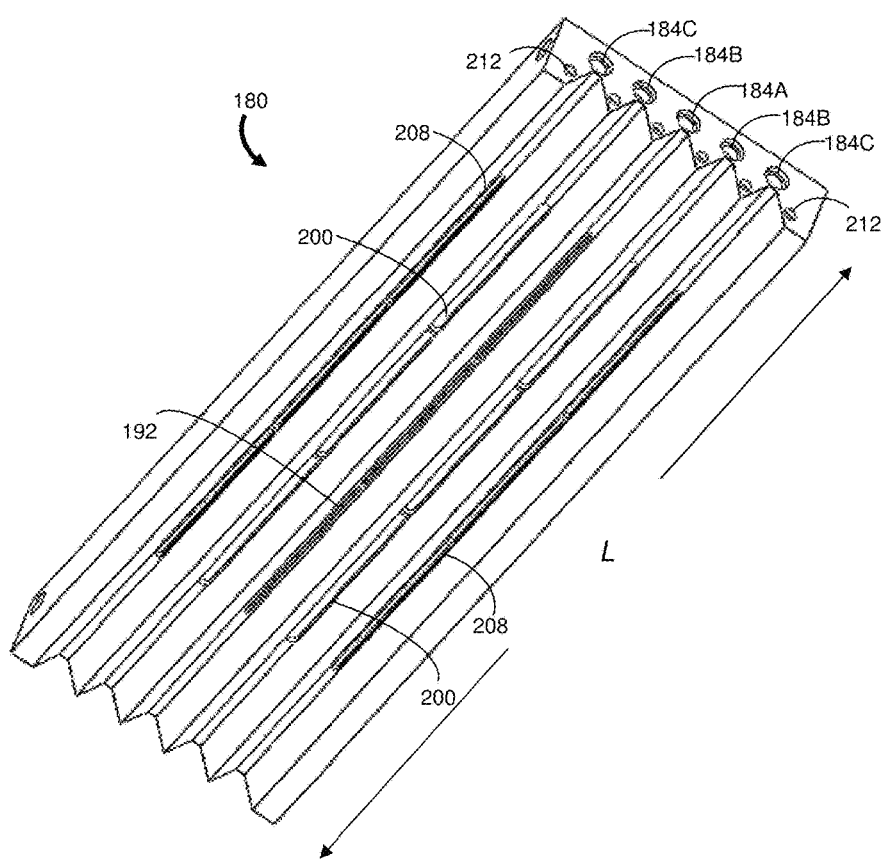
FIGS. 13A and 13B are a perspective view and a side view, respectively, of an embodiment of a showerhead according to the invention.
Figure 13B:
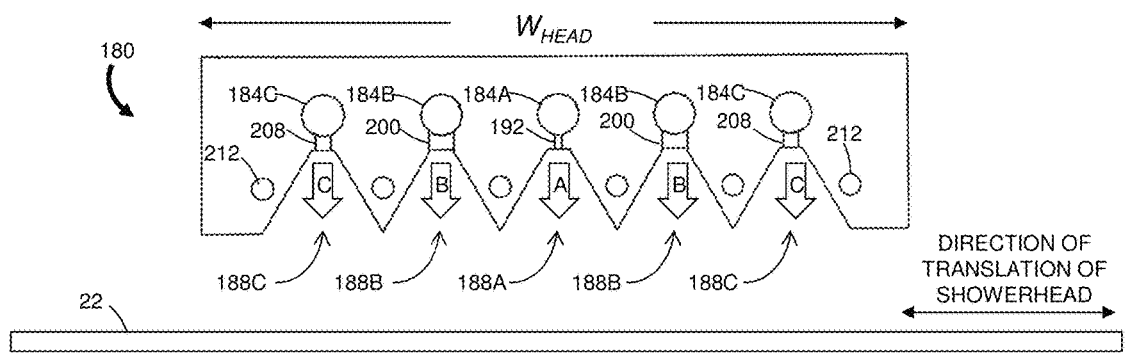

FIG. 13A is a perspective view of the underside of an embodiment of a movable showerhead 180 that can be used in a linear batch CVD system such as the system shown in FIGS. 12A to 12C. Reference is also made to FIG. 13B which shows a cross-sectional view of the showerhead 180 looking along the length L of the showerhead 180. The dimensions of the illustrated showerhead 180 relative to the wafer 22 are shown as disproportionately greater so that the structure of the showerhead 180 can be seen in greater detail.

Precursor gas conduits (i.e., showerhead conduits) 184 extend through the showerhead 180 and parallel to its length L. An inner channel 188A having a nominally V-shaped cross-section extends parallel to and underneath the middle conduit 184A. A flow of a precursor gas A passes from the middle conduit 184A through a slot 192, or substantially linear arrangement of holes, and through the inner channel 188A toward the upper surface of wafers 22 loaded in a wafer carrier on a heater stage (not shown). The inner channel 188A is disposed between a pair of parallel outer channels 188B that supply a second precursor gas B from respective precursor gas conduits 184B through slots 200, or holes, in a downward direction toward the wafers 22. The inner channel 188A and outer channels 188B are disposed between a pair of parallel outermost channels 188C. The outermost channels 188C have slots 208 or holes to supply a third precursor gas C from respective precursor gas conduits 184C, or can alternatively be used to supply one of the first or second precursor gases A or B from the conduits 184C. The dimensions of the slots 192, 200 and 208 can be similar to each other or may differ according to the flow requirements or fluid characteristics of the respective precursor gases. Cooling channels 212 extend lengthwise parallel to the channels 188. The cooling channels 212 conduct water or other fluid to control or limit the temperature of the showerhead 180 during process runs. The deposition chamber includes a pumping port arrangement so that the precursor gases A and B are drawn from the upper surface of the wafers 22 outward and then downward past the edge of the wafer carrier. In an alternative configuration, the outermost channels 188C are vacuum channels that exhaust the precursor gases A and B that do not react at the wafers 22.

The showerhead 180 is separated from the upper surface of the wafers 22 during operation. For example, the clearance between the bottom of the showerhead 180 and the upper surface of the wafers 22 can be less than 0.01 in. to more than 2.0 in. although other clearances may be acceptable according to the requirements of a particular process run. The range of travel for the showerhead 180 extends from one end position beyond one edge of the wafers 22 to an opposite end position beyond the diametrically opposite edges of the wafers 22. Thus the range of travel is substantially greater than the diameter of the wafers 22. During deposition processes, the showerhead 180 moves back and forth over the wafers 22 between the two end positions. Advantageously, the interaction of the precursor gases is substantially limited to a volume defined substantially near to and between the bottom of the showerhead 180 and the upper surfaces of the wafers 22. Thus parasitic deposition elsewhere in the deposition chamber is significantly reduced.

Figure 14:
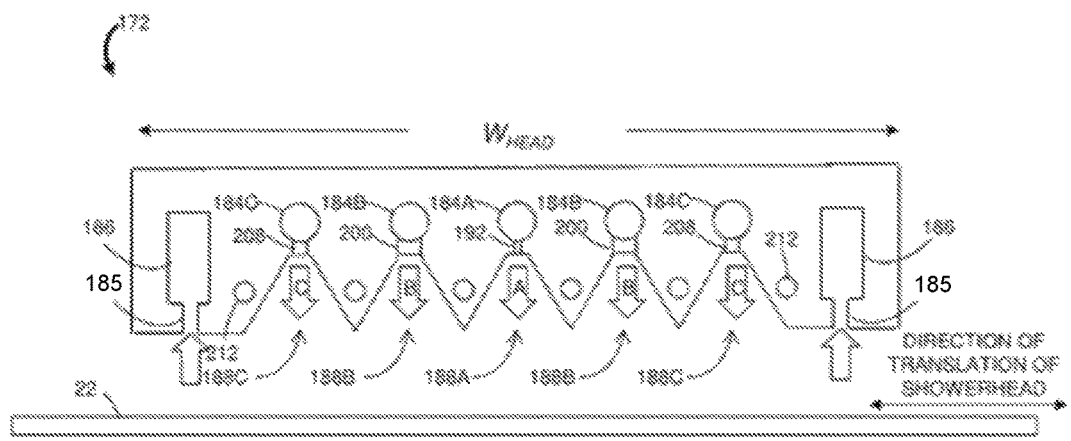
FIG. 14 is a cross sectional view of an alternative embodiment of a showerhead according to the invention.

An alternative embodiment of a showerhead apparatus 172 is shown in a cross-sectional view in FIG. 14. The channels 188 are disposed between a pair of vacuum channels 185 that communicate with internal vacuum conduits 186 to exhaust the gases from the deposition chamber. Advantageously, the precursor gases are substantially limited to reacting at the surface of the wafers immediately below the channels 188, and therefore parasitic deposition in other regions of the deposition chamber is substantially eliminated.

Figure 15:
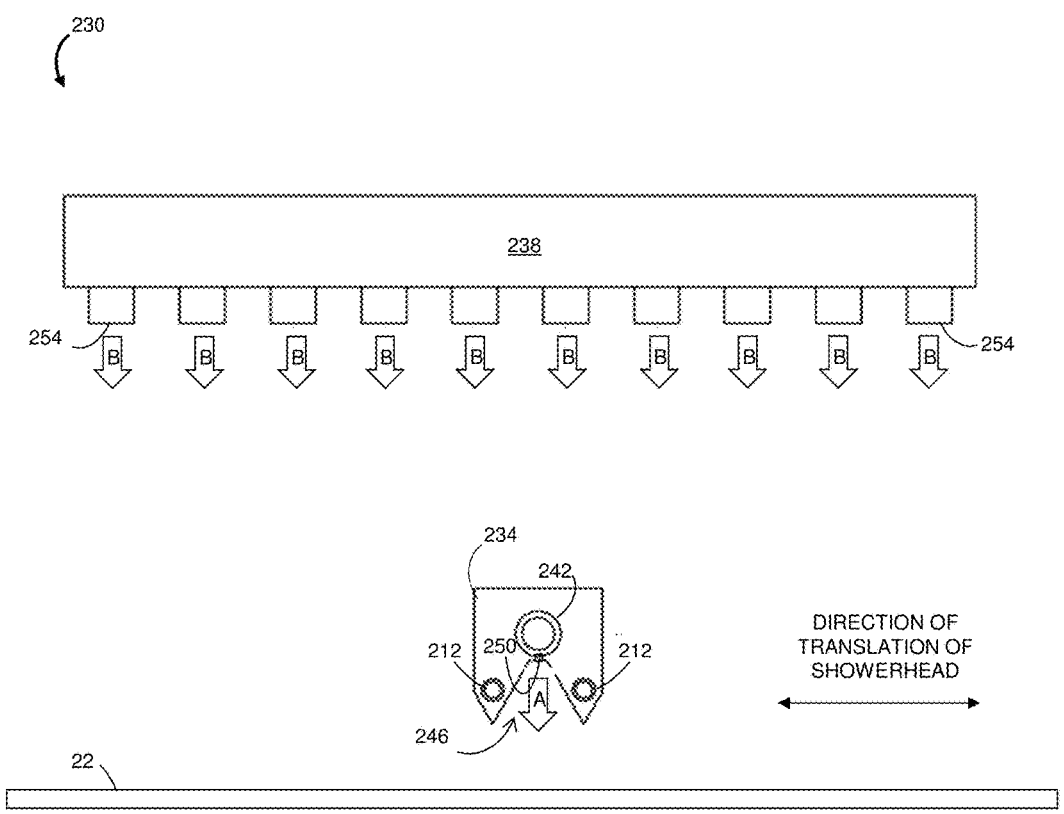
FIG. 15 is a cross-sectional view of another embodiment of a showerhead according to the invention.

FIG. 15 shows a cross-sectional view of another embodiment of a showerhead apparatus 230 which comprises a movable showerhead body 234 and a stationary showerhead body 238. In this embodiment, the movable showerhead body 234 has a single channel 246 and a single showerhead conduit 242. A flow of precursor gas A exits through a slot 250, or arrangement of holes, passes through the channel 246 and downward to the upper surface of the wafers 22. The motion of the movable showerhead body 234 is similar to the motion described above for other embodiments of movable showerheads. The separation of the stationary showerhead body 238 from the wafers 22 is much greater than the distance between the movable showerhead body 234 and the wafers 22 and preferably is optimized to control buoyancy effects. The stationary showerhead body 238 has a large number of slots or holes 254 from which a second precursor gas B is directed generally downward toward the wafers 22. Although the second precursor gas B is present throughout a larger region of the deposition chamber than for the embodiments described above, the region in which the first and second precursor gases A and B interact is substantially limited to the volume defined between the lower portion of the movable showerhead body 234 and the upper surface of the wafers 22. Consequently, parasitic deposition is substantially reduced relative to deposition chambers equipped with conventional showerheads.

While the invention has been shown and described with reference to specific embodiments, it should be understood by those skilled in the art that various changes in form and detail may be made therein without departing from the spirit and scope of the invention as recited in the accompanying claims.

What is claimed is:

1. An apparatus comprising:
   a deposition chamber;
   a stationary substrate carrier disposed in the deposition chamber and having a plurality of receptacles each configured to receive a planar disc substrate on an exposed surface of an intermediate substrate carrier disposed in each said receptacle, said plurality of receptacles arranged in a linear configuration;
   a moveable showerhead, disposed in the deposition chamber and above said stationary substrate carrier, having a showerhead conduit to conduct a first precursor gas along a length of the showerhead, a channel along a surface of the showerhead and disposed parallel to the length, and at least one opening between the showerhead conduit and the channel to supply the first precursor gas from the showerhead conduit to the channel;
   a gas supply conduit having an end in communication with the showerhead conduit and an opposite end configured to receive the first precursor gas;
   a translation mechanism in communication with the showerhead and configured to translate the showerhead in a forward motion and a reverse motion in a direction of motion that is parallel to a width of the showerhead, said translation mechanism comprising a motor-driven lead screw mechanically coupled to a moveable mounting plate, the mounting plate coupled to a pair of parallel rigid arms at a first end of said rigid arms, the rigid arms further joined to said moveable showerhead at a second end of said rigid arms, the pair of rigid arms only passing through a first wall of said deposition chamber; and
   a stationary showerhead, disposed in the deposition chamber and above said moveable showerhead, the stationary showerhead having a plurality of slots or holes from which a second precursor gas is directed downward toward the receptacles,
   wherein the first precursor gas received at the gas supply conduit is provided along a length of the channel, the translation mechanism translating the showerhead according to a movement of said motor-driven lead screw.

2. The apparatus of claim 1 wherein the at least one opening comprises a slot having a length that is parallel to the length of the moveable showerhead.

3. The apparatus of claim 1 wherein the at least one opening comprises a plurality of holes configured in a substantially linear arrangement that is parallel to the length of the showerhead conduit.

4. The apparatus of claim 1 wherein the showerhead apparatus comprises a second gas supply conduit, the gas supply conduit in communication with one end of the showerhead conduit and the second gas supply conduit having an end in communication with an opposite end of the showerhead conduit.

5. The apparatus of claim 4 further comprising at least one adjustable flow controller in communication with one of the gas supply conduits that is configured to adjust a velocity of the first precursor gas to thereby enable control of a deposition thickness along a direction parallel to the length of the moveable showerhead.

6. The apparatus of claim 1 wherein the opposite end of the gas supply conduit is configured to receive the first precursor gas and a carrier gas.

7. The apparatus of claim 1 further comprising, for each rigid arm, a bellows surrounding a portion of a length of such rigid arm, the bellows coupled at one end to a surface of such rigid arm and coupled at an opposite end to a wall of the deposition chamber to thereby seal the deposition chamber and maintain a vacuum environment therein during translation of the moveable showerhead.

8. The apparatus of claim 1 wherein the moveable showerhead has a vacuum conduit, a vacuum channel along the surface of the showerhead and disposed parallel to the length of the showerhead, and at least one opening between the vacuum conduit and the vacuum channel, the vacuum conduit configured to exhaust at least a portion of the first precursor gas that is provided from the channel of the moveable showerhead that does not react within the deposition chamber.

9. The apparatus of claim 1 further comprising:
a control system in communication with the translation mechanism to control a translation rate of the moveable showerhead; and
a measurement device for determining a thickness of a deposited layer on a substrate and being in communication with the control system, wherein the translation rate of the moveable showerhead is controlled in response to a determination of the thickness of the deposited layer.

10. The apparatus of claim 1 wherein the gas supply conduit includes a flexible tube.

11. The apparatus of claim 1 further comprising a ferrofluidic rotary feedthrough disposed at a location where one of the rigid arms and the gas supply conduit movably pass through the wall of the deposition chamber.

12. The apparatus of claim 1, further comprising a pair of vertical brackets, disposed outside of said deposition chamber, and each having an upper end and a lower end, the upper ends of the vertical brackets connecting the respective pair of rigid arms to the respective vertical brackets and the lower ends of the vertical brackets connecting the vertical brackets to said mounting plate.

13. The apparatus of claim 1, wherein said mounting plate is attached to a set of moveable carriers that engage stationary rails, the rails being parallel to one another and parallel to said direction of movement, the carriers sliding on said rails, so that each of the moveable showerhead, rigid arms and mounting plate translate along said direction of movement according to an action of said motor.

14. The apparatus of claim 1, wherein all of the receptacles in the stationary substrate carrier have a diameter and are arranged in a single row that is parallel to a length of the deposition chamber to hold the planar disc substrates in a straight line and horizontal coplanar configuration.

15. The apparatus of claim 14, further comprising a second channel along the surface of the moveable showerhead, the second channel in fluid communication with a second showerhead conduit, wherein each channel has a shape of a linear slot having a length that is greater than the diameters of the receptacles, each of the linear slots being parallel to one another and parallel to the single row of receptacles, each of the conduits supplying a different gas through the respective one of the channels toward the stationary substrate carrier.

16. The apparatus of claim 15, wherein each linear slot has a V-shaped cross-section.

17. The apparatus of claim 1, wherein each receptacle has a plurality of air injector channels defined therein, the air injector channels configured to introduce a gas to flow upward to float and rotate the intermediate substrate carrier about a vertical axis that extends through a center of the exposed surface of the intermediate substrate carrier.

* * * * *